United States Patent [19]
Yoshida

[11] Patent Number: 6,107,833
[45] Date of Patent: Aug. 22, 2000

[54] OUTPUT BUFFER CIRCUIT OF IC CIRCUIT CAPABLE OF SUPPRESSING POWER CONSUMPTION

[75] Inventor: Kenichi Yoshida, Tokyo, Japan

[73] Assignee: NEC Corporation, Tokyo, Japan

[21] Appl. No.: 09/198,395

[22] Filed: Nov. 24, 1998

[30] Foreign Application Priority Data

Nov. 26, 1997 [JP] Japan ..................................... 9-324983

[51] Int. Cl.$^7$ ................... H03K 19/0175; H03K 19/094; H03K 17/16
[52] U.S. Cl. .............................. 326/83; 326/112; 326/27; 327/391
[58] Field of Search ................................ 326/82–83, 86, 326/26–27, 112, 119, 121; 327/391, 437

[56] References Cited

U.S. PATENT DOCUMENTS

| | | | |
|---|---|---|---|
| 4,992,677 | 2/1991 | Ishibashi et al. | 326/27 |
| 5,166,558 | 11/1992 | Ohsawa | 326/71 |
| 5,598,119 | 1/1997 | Thayer et al. | 327/111 |
| 5,666,069 | 9/1997 | Gibbs | 326/81 |

FOREIGN PATENT DOCUMENTS 5-243957   9/1993   Japan .

*Primary Examiner*—Michael Tokar
*Assistant Examiner*—James H. Cho
*Attorney, Agent, or Firm*—McGinn & Gibb, P.C.

[57] ABSTRACT

An output buffer circuit includes an input terminal for inputting an externally supplied signal voltage into the output buffer circuit, a first transistor having a first current path, a first voltage being applied to one end of he first current path, a second transistor having a second current path, one end of the second current path being connected to the other end of the first current path and a second voltage being applied to the other end of the second current path, a first comparing circuit for comparing the signal voltage applied from the input terminal with a voltage appearing across the first transistor and second transistor and subdivided by both the first and second transistors, a second comparing circuit for comparing a reference voltage with the voltage appearing across the first transistor and the second transistor and subdivided by both the first and second transistors, a control circuit for supplying a control signal to control terminals of the first and second transistors based upon comparison results of the first and second comparing circuits so as to control a voltage change in the subdivided voltage between the first and second transistors with respect to the input signal voltage, and an output terminal for outputting a voltage appearing across the first transistor and the second transistor by controlling the voltage change in the subdivided voltage in response to the control signal in the control circuit.

7 Claims, 9 Drawing Sheets

6,107,833

OUTPUT BUFFER CIRCUIT OF IC CIRCUIT CAPABLE OF SUPPRESSING POWER CONSUMPTION

BACKGROUND OF THE INVENTION

1. Field of the Invention

The present invention generally relates to an output buffer circuit. More specifically, the present invention is directed to such an output buffer circuit built in an integrated circuit, capable of suppressing power consumption caused by a penetration current of a CMOS transistor.

2. Description of the Related Art

In conventional logic ICs (integrated circuits) used in radio (wireless) appliances, a major subject is how to reduce noise contained in voltage signals derived from output buffers as low as possible. For instance, Japanese Patent Laid-open Application No. Hei-5-243957 published in 1993 describes one of this sort of conventional output buffer circuits.

FIG. 10 represents a circuit arrangement of the conventional output buffer circuit.

In this output buffer circuit, when a level of an input signal entered from the input terminal 88 is equal to an "L (Low)" level, namely is under normal state, a level of an output signal from the integrating circuit 87 becomes an "L" level. On the other hand, a level of an output signal outputted from the output terminal 83 becomes an "L" level. At this time, a level of an output signal outputted from the comparator 86 becomes an "H (High)" level, and a level of an output signal outputted from the NOT gate 80 becomes an "H" level. As a result, both a level of an output signal derived from the control circuit 84 constructed of the OR gate circuit, and a level of another output signal derived from the control circuit 85 constituted by the AND gate circuit become "H" level. Therefore, the p-channel MOS transistor 81 is turned OFF and the n-channel MOS transistor 82 is turned OFF, so that a level of an output signal outputted from the output terminal 83 becomes an "L" level.

Next, when the level of the input signal is changed from "L" into "H", the integrating circuit 87 gradually changes the level of the output signal from "L" to "H" in accordance with the time constant thereof. In such a case that the level of the output signal outputted from this integrating circuit becomes higher than the level of the output signal outputted from the output terminal 83, the level of the output signal derived from the comparator 86 becomes an "L" level, so that the p-channel MOS transistor 81 is turned ON, and also n-channel MOS transistor 82 is turned OFF. As a result, the level of the output signal outputted from the output terminal 83 is increased.

Then, when the level of the output signal derived from the output terminal 83 becomes higher than the level of the output signal derived from the integrating circuit 87, the signal of the output signal from the comparator 86 becomes an "H" level, so that the p-channel MOS transistor 81 is turned OFF. As a consequence, increasing of the voltage of the output signal derived from the output terminal is interrupted.

Furthermore, in the case that the level of the output signal derived from the integrating circuit 87 is increased and then this increased level of the output signal again becomes higher than the level of the output terminal 83, the level of the output signal from the comparator 86 becomes an "L" level, so that the level of the output signal outputted from the output terminal 83 is increased. In other words, in this conventional output buffer circuit, the level of the output signal derived from the output terminal 83 may follow the output signal of the integrating circuit 87. As a consequence, while the rapid increase of the output signal caused by the noise contained in the input signal is suppressed, the noise component contained in the output signal can be reduced.

However, in accordance with the above-explained conventional output buffer circuit, this output buffer circuit is designed based upon only the noise reduction in the output voltage, but not considering such an aspect that the power consumption caused by the penetration current of the CMOS transmitter is suppressed. This CMOS transistor is constructed of the p-channel MOS transistor 81 and the n-channel MOS transistor 82. In other words, the above-explained conventional output buffer circuit owns such a problem that the changing speed of the voltage is slow, and therefore, since a large amount of penetration currents will flow, the resulting power consumption is increased.

SUMMARY OF THE INVENTION

The present invention has been made to solve the above-explained problem, and therefore, an object to provide an output buffer circuit capable of suppressing noise components contained in an output voltage signal thereof, and also capable of reducing power consumption.

To achieve the above-described object, an output buffer circuit, according to an aspect of the present invention is featured by comprising:

an input terminal for inputting an externally supplied signal voltage into the output buffer circuit;

a first transistor having a first current path, a first voltage being applied to one end of the first current path;

a second transistor having a second current path, one end of the second current path being connected to the other end of the first current path and a second voltage being applied to the other end of the second current path;

a first comparing circuit for comparing the signal voltage applied from the input terminal with a voltage appearing across the first transistor and second transistor and subdivided by both the first and second transistors;

a second comparing circuit for comparing a reference voltage with the voltage appearing across the first transistor and the second transistor and subdivided by both the first and second transistors;

a control circuit for supplying a control signal to control terminals of the first and second transistors based upon comparison results of the first and second comparing circuits so as to control a voltage change in the subdivided voltage between the first and second transistors with respect to the input signal voltage; and an output terminal for outputting a voltage appearing across said first transistor and the second transistor by controlling the voltage change in the subdivided voltage in response to the control signal in the control circuit.

In this output buffer circuit, when the control circuit controls the control signal supplied to the control terminals of the first and second transistors so as to gradually change the output voltage when the input signal voltage is changed, the adverse influence caused by the noise contained in the input signal voltage can be suppressed. On the other hand, after sufficient time capable of suppressing the adverse influence of this noise has passed, when the voltage outputted from the output terminal is changed in a substantially same manner to the input signal voltage, the current flowing between the first and second transistors, namely the penetration current can be shortened, so that the power consumption of this output buffer circuit can be suppressed.

It should be noted that the control circuit may change this control signal based on the reference voltage. As a result, the output buffer circuit may be readily designed by properly setting this reference voltage, taking account of the noise suppression, or the reduction of the power consumption as a major aspect thereof.

In accordance with the above-described output buffer circuit, in such a case that the control circuit judges based upon the comparison result of the first comparing circuit that the input signal voltage is higher than the subdivided voltage appearing across the first transistor and the second transistor, while the second comparing circuit compares the voltage subdivided by the first and second transistors with the reference voltage, if the subdivided voltage becomes lower than the reference voltage, then the control circuit controls the control signal supplied to the control terminals of the first and second transistors in such a manner that said subdivided voltage is gradually increased, as compared with an increase of the input signal voltage; and while the second comparing circuit compares the voltage subdivided by the first and second transistors with the reference voltage, if the subdivided voltage becomes higher than the reference voltage, then the control circuit controls the control signal supplied to the control terminals of the first and second transistors in such a manner that said subdivided voltage is increased faster than the gradual increase performed when the subdivided voltage becomes lower than the reference voltage.

Also, in accordance with the above-explained output buffer circuit, in such a case that the control circuit judges based upon the comparison result of the first comparing circuit that the input signal voltage is lower than the subdivided voltage appearing across the first transistor and the second transistor, while the second comparing circuit compares the voltage subdivided by the first and second transistors with the reference voltage, if the subdivided voltage becomes higher than the reference voltage, then the control circuit controls the control signal supplied to the control terminals of the first and second transistors in such a manner that the subdivided voltage is gradually decreased, as compared with a decrease of the input signal voltage; and while the second comparing circuit compares the voltage subdivided by the first and second transistors with the reference voltage, if the subdivided voltage becomes lower than the reference voltage, then the control circuit controls the control signal supplied to the control terminals of the first and second transistors in such a manner that the subdivided voltage is decreased faster than the gradual decrease performed when the subdivided voltage becomes higher than the reference voltage.

The second comparing circuit is arranged by two sets of comparators. These two comparators compare the subdivided voltage with two different reference voltages, respectively. As a result, the resultant output buffer circuit is capable of buffering the noise components when the input voltage is increased, and also the input voltage is decreased.

The output buffer circuit is further comprised of: a delay circuit for delaying a voltage change contained in the input signal voltage to supply the delayed input signal voltage to the first comparing circuit.

Also in the output buffer circuit, the first and second transistors are constituted by a CMOS transistor made of a p-MOS transistor and an n-MOS transistor.

When the first and second transistors are constituted by a CMOS transistor, waste power is consumed by the penetration current caused by the voltage change between the p-MOS transistor and the n-MOS transistor. As a consequence, since the time duration for the voltage change can be shortened in the output buffer circuit of the present invention, the penetration current can be lowered, resulting in suppressing the waste power consumption.

BRIEF DESCRIPTION OF THE DRAWINGS

The above and other objects, advantages and features of the present invention will more apparent from the following description taken in conjunction with the accompanying drawings in which.

DESCRIPTION OF THE PREFERRED EMBODIMENTS

Referring to drawings, various preferred embodiments of the present invention will be described in detail.

IC SYSTEM WITH OUTPUT BUFFER CIRCUIT

Figure 1:
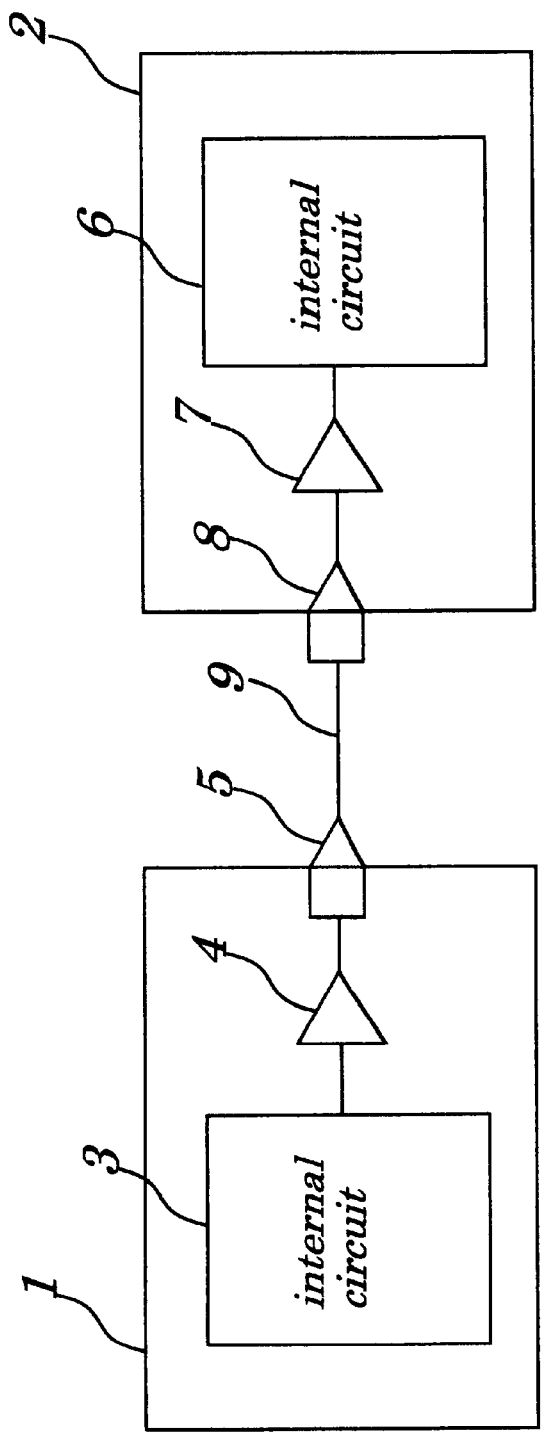
FIG. 1 schematically shows an arrangement of a system with employment of an IC to which an output buffer circuit according to an embodiment of the present invention is applied.

FIG. 1 shows a structural diagram of a system with employment of an IC (integrated circuit) to which an output buffer circuit according to an embodiment of the present invention is applied.

As indicated in this drawing, this system is constructed by an output-sided IC 1 and an input-sided IC 2, which are mounted on a printed-circuit board (not shown in detail). The output-sided IC 1 is constituted by an internal circuit 3, an output buffer circuit 4, and an output terminal 5. Also, the input-sided IC 2 is constructed of an internal circuit 6, an input buffer circuit 7, and an input terminal 8. The output terminal 5 is connected to the input terminal 8 by way of a wiring line 9 formed on the printed-circuit board.

In this IC system, a signal processed by the internal circuit 3 of the output-sided IC 1 is outputted via the output buffer 4 from the output terminal 5. In the input-sided IC 2, the signal outputted from the output terminal 5 is entered via the wiring line 9 to the input terminal 6. The signal entered into this input terminal 6 is supplied via the input buffer 7 to the internal circuit 8. Then, a predetermined process operation is carried out with respect to this signal by the internal circuit 8.

CIRCUIT ARRANGEMENT OF FIRST OUTPUT BUFFER CIRCUIT

Figure 2:
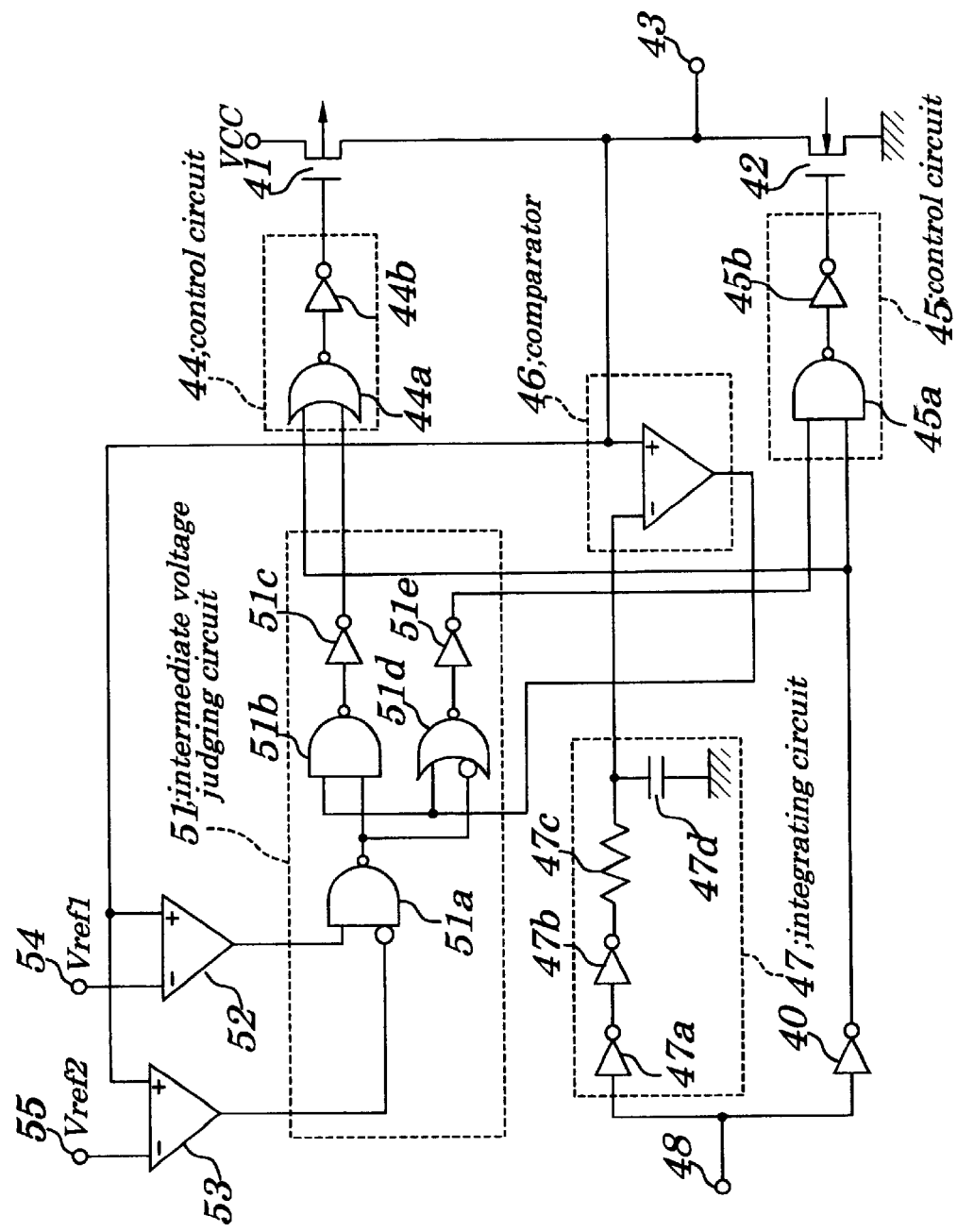
FIG. 2 represents a circuit arrangement of the output buffer circuit according to the embodiment of the present invention.

FIG. 2 is a circuit block diagram for indicating a circuit arrangement of the output buffer circuit 4 provided in the output-sided IC 1 of FIG. 1.

As presented in this drawing, the output buffer 4 is arranged by a NOT gate 40, a p-channel MOS transistor (will be referred to as a "p-MOS transistor" hereinafter) 41, and an n-channel MOS transistor (will be referred to as an "n-MOS transistor" hereinafter) 42. Further, this output buffer 4 is arranged by an output terminal 43, control circuits 44, 45, a comparator 46, an integrating circuit 47, an input terminal 48, an intermediate voltage judging circuit 51, comparators 52, 53, and also reference voltage input terminals 54, 55.

When a level of a signal entered from the input terminal 48 is lower than, or equal to a predetermined level, the NOT gate 40 supplies a signal having an "H" level to the control circuit 44, whereas when a level of a signal entered from the input terminal 48 is higher than, or equal to a preselected level, the NOT gate 40 supplies another signal having an "L" level to the control circuit 45.

Both the p-MOS transistor 41 and the n-MOS transistor 42 constitute an output stage of this output buffer circuit 4. A source of this p-MOS transistor 41 is connected to a drain of the n-MOS transistor 42, and a voltage subdivided by the p-MOS transistor 41 and the n-MOS transistor 42 is derived from the output terminal 43. A power supply voltage VCC is applied to a drain of the p-MOS transistor 41, and a source of the n-MOS transistor 42 is grounded to which a voltage of 0 V is applied.

Since an "L" level voltage is applied to a gate of the p-MOS transistor 41, this p-MOS transistor 41 is turned ON, so that a path between the drain and the source represents a low resistance value. Since an "H" level voltage is applied to a gate of the n-MOS transistor 42, this n-MOS transistor 42 is turned ON, so that a path between the drain and the source represents a low resistance value. In other words, in the case that the level of the voltage applied to the gate of the n-MOS transistor 42 is an "H" level, and the level of the voltage applied to the gate of the p-MOS transistor 41 is changed into an "L" level, the level of the voltage outputted from the output terminal 43 is changed from an "L" level to an "H" level. On the other hand, in the case that the level of the voltage applied to the gate of the p-MOS transistor 41 is an "H" level, and the level of the voltage applied to the gate of the n-MOS transistor 42 is changed into an "H" level, the level of the voltage outputted from the output terminal 43 is changed from an "H" level to an "L" level. As described above, while the level of the output voltage is changed, the output voltage becomes an intermediate level, so that a penetration current of the CMOS transistor will flow. This penetration current implies such a current which flows between the p-MOS transistor 41 and the n-MOS transistor 42.

The control circuit 44 is arranged by an AND gate circuit constructed of a NOR gate 44a and a NOT gate 44b. In response to an input logic level (state), the control circuit 44 may control a level of a voltage applied to the p-MOS transistor 41.

In a table 1, there is shown a truth table indicative of a relationship between an input logic level and an output logic level in this control circuit 44.

TABLE 1

| INPUT LOGIC LEVEL | | |
|---|---|---|
| NOT GATE 40 | NOT GATE 51c (INTERMEDIATE VOLTAGE JUDGING CIRCUIT) | OUTPUT LOGIC LEVEL NOT GATE 44b (CONTROL CIRCUIT 44) |
| L | L | L |
| L | H | H |
| H | L | H |
| H | H | H |

On the other hand, the control circuit 45 is arranged by an OR gate circuit constructed of a NOR gate 45a and a NOT gate 45b. In response to an input logic level (state), the control circuit 45 may control a level of a voltage applied to the gate of the n-MOS transistor 42.

A table 2 represents a truth table indicative of a relationship between an input logic level and an output logic level in this control circuit 45.

TABLE 2

| INPUT LOGIC LEVEL | | |
|---|---|---|
| NOT GATE 40 | NOT GATE 51e (INTERMEDIATE VOLTAGE JUDGING CIRCUIT) | OUTPUT LOGIC LEVEL NOT GATE 45b (CONTROL CIRCUIT 45) |
| L | L | L |
| L | H | L |
| H | L | L |
| H | H | H |

The integrating circuit 47 is arranged by NOT circuits 47a, 47b; a register 47c; and a capacitor 47d. In this integrating circuit 47, a waveform of an input signal entered into the input terminal 48 of the first output buffer circuit 4 is shaped by the NOT circuits 47a and 47b, and the waveform-shaped signal is integrated by the resistor 47b and the capacitor 47d in order to reduce a noise component contained in this input signal.

The comparator 46 compares the output voltage derived from the output terminal 43 with the output voltage derived from the integrating circuit 47. When the output voltage derived from the output terminal 43 is higher than the output voltage derived from the integrating circuit 47, this comparator 46 outputs a signal having a "H (high)"-level signal.

On the other hand, the comparator 52 compares the output voltage derived from the output terminal 43 with a reference voltage Vref1 entered from the reference voltage input terminal 54. When the output voltage derived from the output terminal 43 is higher than this reference voltage, this comparator 52 outputs a signal having an "H"-level. It should be noted that the reference voltage Vref1 entered from the reference voltage input terminal 54 corresponds to a maximum value of an "L (low)" level in a CMOS transistor.

Furthermore, the comparator 53 compares the output voltage derived from the output terminal 43 with another reference voltage Vref2 entered from the reference voltage input terminal 55. When the output voltage derived from the output terminal 43 is higher than this reference voltage, this comparator 53 outputs a signal having an "H"-level. It should be noted that the reference voltage Vref2 entered from the reference voltage input terminal 54 corresponds to a maximum value of an "H (high)" level in a CMOS transistor.

The intermediate voltage judging circuit 51 is arranged by a NAND gate 51a, another NAND gate 51b, a NOT gate 51c, another NOT gate 51d, and a further NOT gate 51e. The NAND gate 51a NAND-gates the output signal of the comparator 52 and the inverted output signal of the comparator 53. The NAND gate 51b NAND-gates the output signal derived from the NAND gate 51a and the output signal derived from the comparator 46. The NOT gate 51c inverts the output signal derived from the NAND gate 51b. The NOR gate 51d NOR-gates the inverted output signal of the NAND gate 51a and the output signal of the ocmparator 46. The NOT gate 51e inverts the output signal derived from the NOR gate 51d.

A table 3 indicates a truth table indicative of a relationship between an input logic level and an output logic level in the intermediate voltage judging circuit 51.

TABLE 3

| INPUT LOGIC LEVEL | | | OUTPUT LOGIC LEVEL | |
|---|---|---|---|---|
| COMPARA-TOR 52 | COMPARA-TOR 53 | COMPARA-TOR 46 | NOT GATE 51c | NOT GATE 51e |
| L | L | L | L | L |
| L | L | H | H | H |
| L | H | L | L | L |
| L | H | H | H | H |
| H | L | L | L | H |
| H | L | H | L | H |
| H | H | L | L | L |
| H | H | H | H | H |

The intermediate voltage judging circuit 51 controls the control circuits 44 and 45 based upon the output logic levels of the NOT gates 51c and 51e indicated in this truth table of the table 3.

BUFFERING OPERATION OF FIRST OUTPUT BUFFER CIRCUIT

Now, a description is made of buffering operation of the output buffer circuit 4 according to the first embodiment.

Under initial condition, it is now assumed that the level of the input voltage entered from the input voltage entered from the input terminal 48 is equal to an "L" level whereas the level of the output voltage outputted from the output terminal 43 is also equal to an "L" level. This initial condition corresponds to the normal condition. When sufficient time has passed under this condition, the level of the output voltage derived from the integrating circuit 7 also becomes an "L" level. As a result, the level of the output signal of the comparator 46 becomes an "H" level, and both the levels of the output signals derived from the comparators 52 and 53 become "L" levels, respectively. As a result, as indicated in the truth table of the table 3, the levels of the signals supplied from the intermediate voltage judging circuit 49 to the control circuits 44 and 45 become "H" levels. On the other hand, in this case, the level of the signal supplied from the NOT gate 40 to the control circuits 44 and 45 becomes an "H" level. As a consequence, as shown in the truth tables of the table 1 and the table 2, any of the levels of the output signals from the control circuits 44 and 45 becomes an "H" level, so that the p-MOS transistor 41 is turned ON and the n-MOS transistor 42 is turned OFF.

Figure 3:
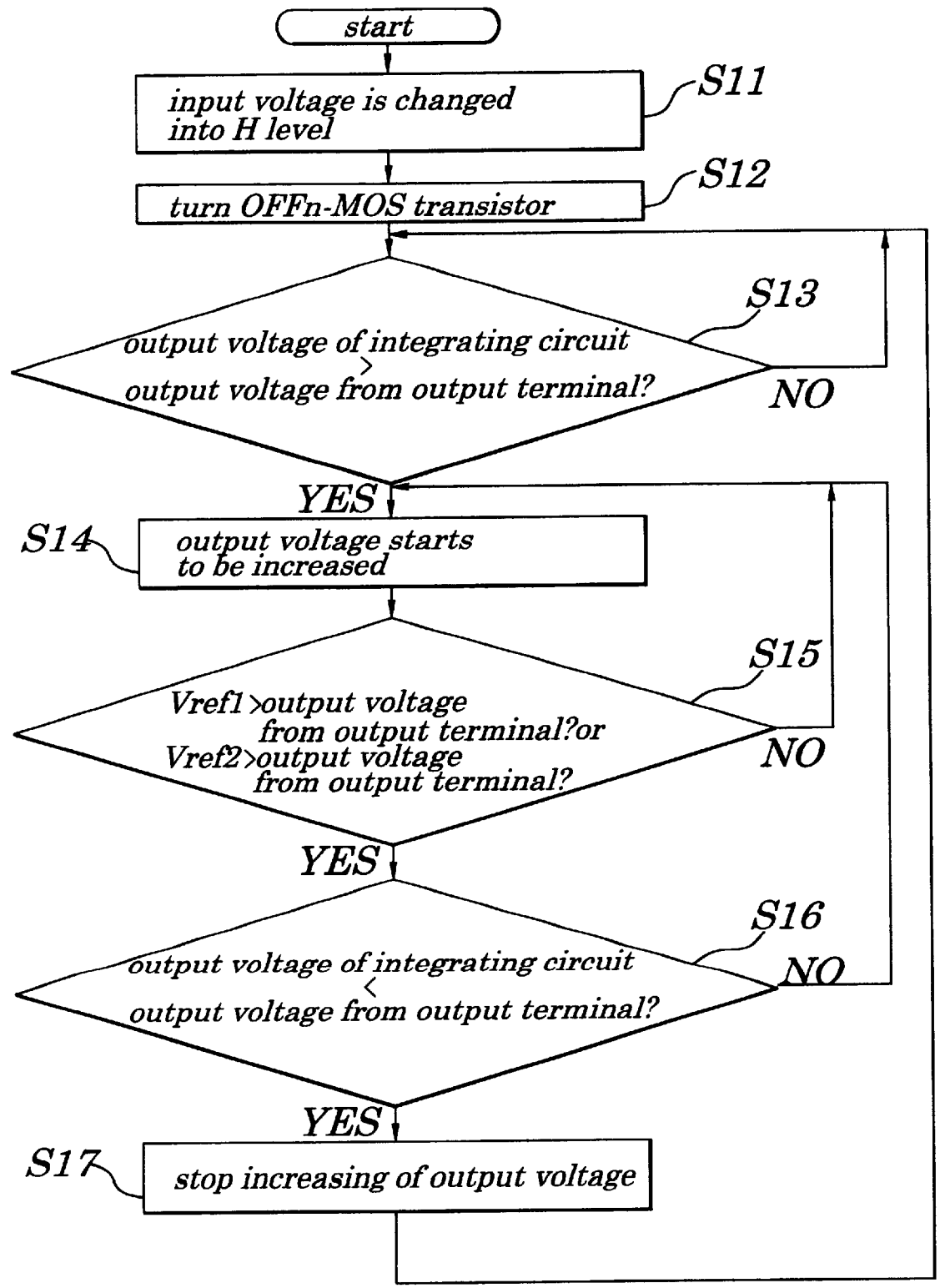
FIG. 3 is a flow chart for describing operation of the output buffer circuit shown in FIG. 2 in the case that an output voltage is changed from a low level into a high level.

Operation of the first buffer circuit 4 is described with reference to a flow chart shown in FIG. 3 in such a case that the level of the input voltage entered from the input terminal 43 is changed from this condition into an "H" level.

When the level of the input voltage applied from the input terminal 43 is changed into the "H" level, the level of the output signal from the NOT gate 40 becomes an "L" level (step S11). As a result, as indicated in the truth table of the table 2, the level of the signal outputted from the control circuit 45 becomes an "L" level, so that the n-MOS transistor 42 is turned OFF (step S12).

On the other hand, the integrating circuit 47 delays such an input voltage whose level is changed into the H level and which is entered from the input terminal 43, and gradually increases the output level. While performing this operation by the integrating circuit 47, the comparator 46 compares the output voltage derived from the integrating circuit 47 with the output voltage derived from the output terminal 43 (step S13). When the output voltage derived from the integrating circuit 47 becomes higher than the output voltage derived from the output terminal 43, this comparator 46 changes the "H" level of the output signal into an "L" level. As a result, as indicated in the truth table of the table 3, the level of the output signal of the NOT gate 51c becomes an "L" level. Also, since the level of the output signal derived from the NOT gate 40 is also equal to an "L" level, as represented in the truth table of the table 1, the level of the output signal derived from the control circuit 44 becomes an "L" level. As a consequence, the p-MOS transistor 41 is turned ON, so that the output voltage derived from the output terminal 43 is commenced to be increased (step S14).

The increase of the output voltage derived from the output terminal 43 is monitored by the comparators 52 and 53, and the output voltage derived from the output terminal 43 is compared with the respective reference voltages Vref1 and Vref2 (step S15). In this output buffer circuit 4, the level of the output signal derived from the comparator 52 remains the "L" level until the output voltage derived from the output terminal 43 exceeds the reference voltage Vref1.

While the level of the output signal from the comparator 52 is left at the "L" level, the output voltage from the integrating circuit 47 is gradually increased, as compared with the output voltage derived from the output terminal 43. The comparator 46 compares the output voltage of the integrating circuit 47 with the output voltage derived from the output terminal 43 (step S16). When the output voltage of the integrated circuit 47 becomes lower than the output voltage derived from the output terminal 43, the comparator 46 changes the level of the output signal from the "H" level to the "L" level. As a result, as indicated in the truth table of the table 3, the level of the output signal from the NOT gate 51c becomes an "H" level, and as represented in the truth table of the table 1, the level of the output signal from the control circuit 44 becomes an "H" level. As a consequence, the p-MOS transistor 41 is turned OFF, and then increasing of the output voltage derived from the output terminal 43 is stopped (step S17).

Even after increasing of the output voltage derived from the output terminal 43 is stopped, the output voltage derived from the integrating circuit 47 is continued to be gradually increased. Then, when the output voltage derived from the integrating circuit 47 becomes higher than the output voltage derived from the output terminal 43 (step S13), the level of the output signal from the comparator 46 is changed into an "L" level, so that the level of the output signal derived from the control circuit 44 becomes an "L" level, and therefore, the p-MOS transistor 41 is turned ON. As a result, the output voltage derived from the output terminal 43 again starts to be increased (step S14). Subsequently, both increasing of the output voltage and stopping of this voltage increase are repeated until this output voltage derived from the output terminal 43 exceeds the reference voltage Vref1, and thus this output voltage is gradually increased.

When the output voltage derived from the output terminal 43 exceeds the reference voltage Vref1 (step S15), the level of the output signal derived from the comparator 52 becomes an "H" level. As a result, as represented in the truth tables of the table 1 and the table 2, the level of the output signal from the control circuit 44 becomes an "H" level, so that the p-MOS transistor 41 is turned ON. At this time, as indicated in the truth table of the table 3, since the state of the output signal derived from the intermediate voltage judging circuit 51 is maintained, the output voltage derived from the output terminal 43 is rapidly increased without any stopping action irrespective of the level of the output signal derived from the comparator 46 (step S14).

Furthermore, when the output voltage derived from the output terminal 43 exceeds the reference voltage Vref2 (step S15), since the level of the input signal entered from the input terminal 48 similarly exceeds the reference voltage Vref2, the level of the output signal derived from the NOT circuit 40 becomes an "L" level. At this time, as indicated in the truth table of the table 3, the level of the output signal derived from the NOT gate 51c employed in the intermediate voltage judging circuit 51 is changed into an "L" level, or an "H" level in accordance with the comparison results by the comparator 46. In other words, when the output voltage of the integrating circuit 47 is lower than the output voltage derived from the output terminal 43 (step S16), increasing of the output voltage derived from the output terminal 43 is stopped (step S17). Conversely, when the output voltage derived from the integrating circuit 47 is higher than the output voltage derived from the output terminal 43 (step S13), the output voltage derived from the output terminal 43 is increased (step S14). As previously described, while both increasing of the output voltage and stopping of this voltage increase are repeated, this output voltage derived from the output terminal 43 is gradually increased until this output voltage reaches the power supply voltage VCC.

Figure 4:
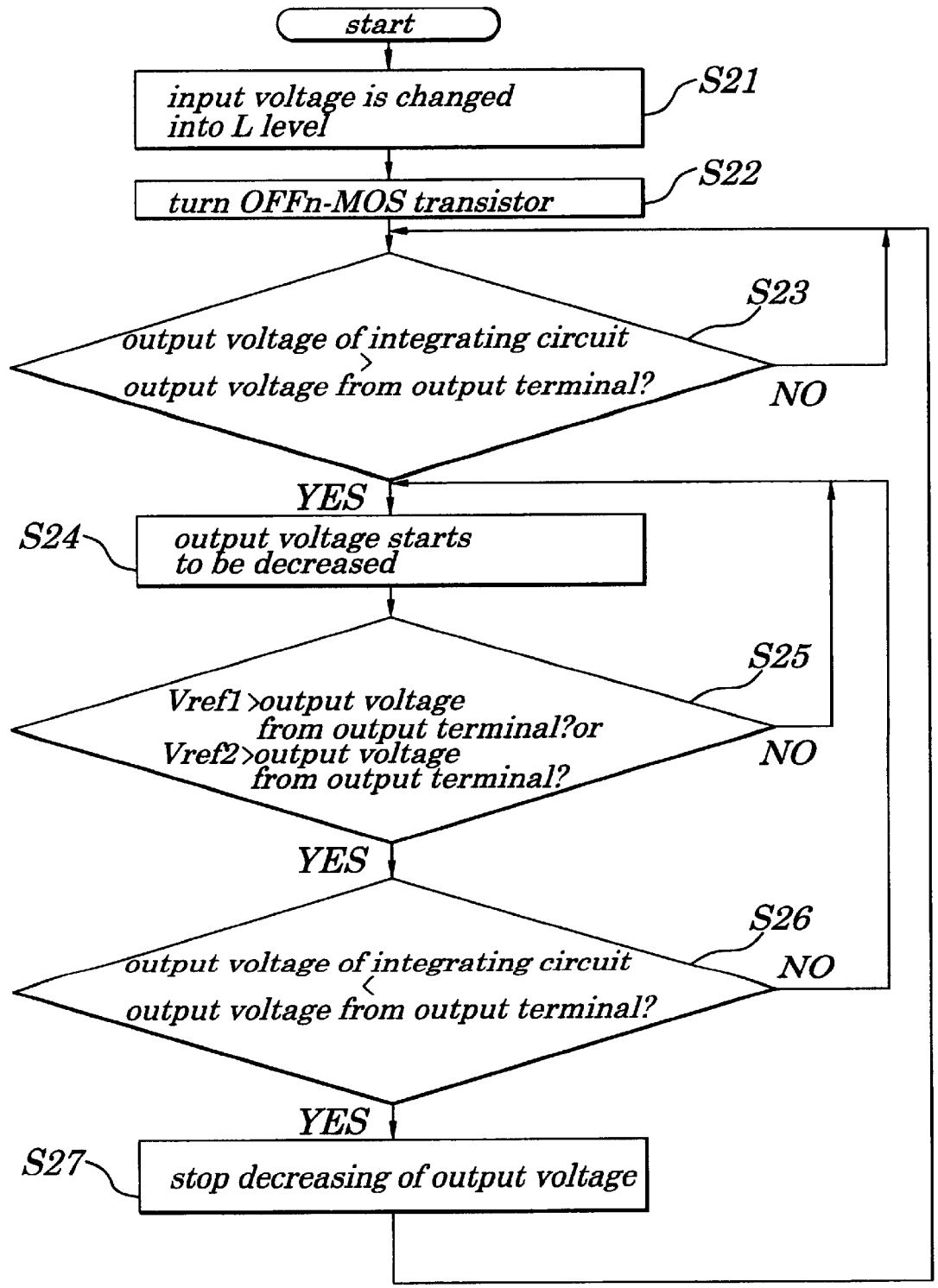
FIG. 4 is a flow chart for describing operation of the output buffer circuit shown in FIG. 2 in the case that an output voltage is changed from a high level into a low level.

Operation of the first buffer circuit 4 is described with reference to a flow chart shown in FIG. 4 in such a case that the level of the input voltage entered from the input terminal 43 is changed from this condition into an "L" level.

When the level of the input voltage applied from the input terminal 43 is changed into the "L" level, the level of the output signal from the NOT gate 40 becomes an "H" level (step S21). As a result, as indicated in the truth table of the table 1, the level of the signal outputted from the control circuit 44 becomes an "H" level, so that the n-MOS transistor 42 is turned OFF (step S22).

On the other hand, the integrating circuit 47 delays such an input voltage whose level is changed into the L level and which is entered from the input terminal 43, and gradually decreases the output level. While performing this operation by the integrating circuit 47, the comparator 46 compares the output voltage derived from the integrating circuit 47 with the output voltage derived from the output terminal 43 (step S23). When the output voltage derived from the integrating circuit 47 becomes higher than the output voltage derived from the output terminal 43, this comparator 46 changes the "H" level of the output signal into an "L" level. As a result, as indicated in the truth table of the table 3, the level of the output signal of the NOT gate 51e becomes an "H" level. Also, since the level of the output signal derived from the NOT gate 40 is also equal to an "H" level, as represented in the truth table of the table 1, the level of the output signal derived from the control circuit 44 becomes an "H" level. As a consequence, the n-MOS transistor 42 is turned ON, so that the output voltage derived from the output terminal 43 is commenced to be decreased (step S24).

The decrease of the output voltage derived from the output terminal 43 is monitored by the comparators 52 and 53, and the output voltage derived from the output terminal 43 is compared with the respective reference voltages Vref1 and Vref2 (step S25). In this output buffer circuit 4, the level of the output signal derived from the comparator 53 remains the "H" level until the output voltage derived from the output terminal 43 becomes lower than the reference voltage Vref2.

While the level of the output signal from the comparator 52 is left at the "H" level, the output voltage from the integrating circuit 47 is gradually decreased, as compared with the output voltage derived from the output terminal 43. The comparator 46 compares the output voltage of the integrating circuit 47 with the output voltage derived from the output terminal 43 (step S26). When the output voltage of the integrated circuit 47 becomes lower than the output voltage derived from the output terminal 43, the comparator 46 changes the level of the output signal from the "H" level to the "L" level. As a result, as indicated in the truth table of the table 3, the level of the output signal from the NOT gate 51e becomes an "L" level, and as represented in the truth table of the table 1, the level of the output signal from the control circuit 44 becomes an "L" level. As a consequence, the n-MOS transistor 42 is turned OFF, and then decreasing of the output voltage derived from the output terminal 43 is stopped (step S27)

Even after decreasing of the output voltage derived from the output terminal 43 is stopped, the output voltage derived from the integrating circuit 47 is continued to be gradually decreased. Then, when the output voltage derived from the integrating circuit 47 becomes higher than the output voltage derived from the output terminal 43 (step S23), the level of the output signal from the comparator 46 is changed into an "L" level, so that the level of the output signal derived from the control circuit 44 becomes an "H" level, and therefore, the n-MOS transistor 42 is turned ON. As a result, the output voltage derived from the output terminal 43 again starts to be increased (step S14). Subsequently, both decreasing of the output voltage and stopping of this voltage decrease are repeated until this output voltage derived from the output terminal 43 becomes lower than the reference voltage Vref2, and thus this output voltage is gradually decreased.

When the output voltage derived from the output terminal 43 becomes lower than the reference voltage Vref2 (step S25), the level of the output signal derived from the comparator 53 becomes an "L" level. As a result, as represented in the truth tables of the table 1 and the table 2, the level of the output signal from the control circuit 45 becomes an "H" level, so that the n-MOS transistor 42 is turned ON. At this time, as indicated in the truth table of the table 3, since the state of the output signal derived from the intermediate voltage judging circuit 51 is maintained, the output voltage derived from the output terminal 43 is rapidly decreased without any stopping action irrespective of the level of the output signal derived from the comparator 46 (step S24).

Furthermore, when the output voltage derived from the output terminal 43 becomes lower than the reference voltage Vref1 (step S25), as indicated in the truth table of the table 3, the level of the output signal derived from the NOT gate 51e employed in the intermediate voltage judging circuit 51 is changed into an "L" level, or an "H" level in accordance with the comparison results by the comparator 46. In other words, when the output voltage of the integrating circuit 47 is lower than the output voltage derived from the output terminal 43 (step S26), decreasing of the output voltage derived from the output terminal 43 is stopped (step S27) Conversely, when the output voltage derived from the integrating circuit 47 is higher than the output voltage derived from the output terminal 43 (step S23), the output voltage derived from the output terminal 43 is decreased (step S24). As previously described, while both decreasing of the output voltage and stopping of this voltage decrease are repeated, this output voltage derived from the output terminal 43 is gradually decreased until this output voltage reaches the power supply voltage VCC.

RELATIONSHIP BETWEEN INPUT VOLTAGE AND OUTPUT VOLTAGE IN OUTPUT BUFFER CIRCUIT

Figure 5:
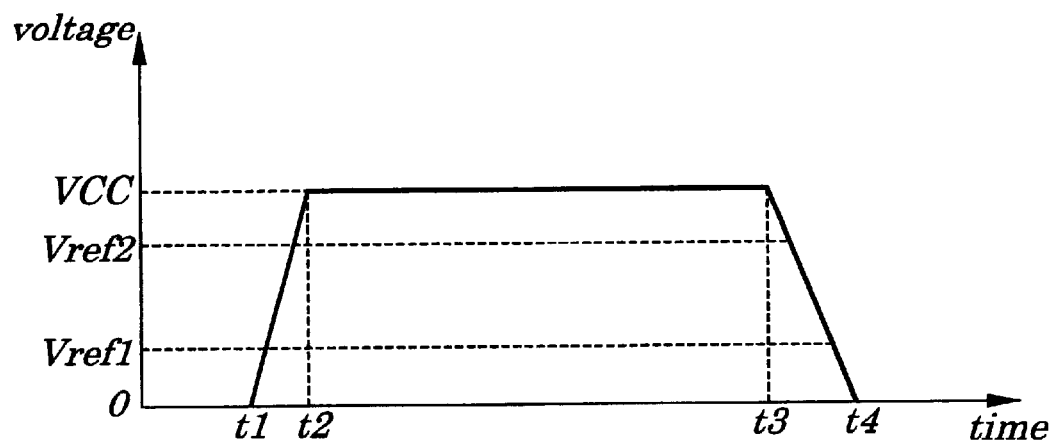
FIG. 5 indicates a waveform diagram of an input voltage in the output buffer circuit of FIG. 2.
Figure 6:
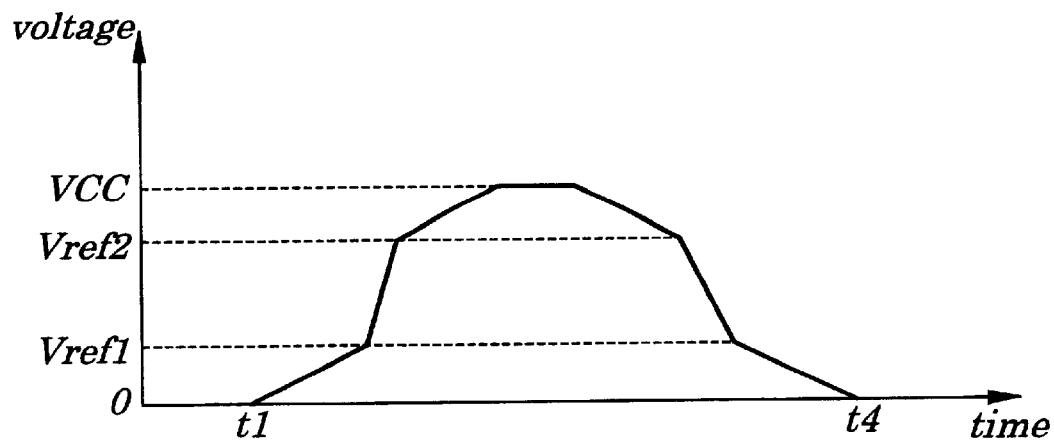
FIG. 6 shows a waveform diagram of an output voltage in the output buffer circuit of FIG. 2.

A relationship between an input voltage and an output voltage in the output buffer circuit 4 according to the first embodiment will be explained with reference to an input waveform diagram of FIG. 5 and an output waveform diagram of FIG. 6.

In such a case that an input voltage entered from the input terminal 48 is rised from 0 V up to the power supply voltage VCC during a time period defined from timing "t1" to timing "t2", after an output voltage outputted from the output terminal 43 is gradually increased up to the reference voltage Vref1, this output voltage is rapidly increased up to the reference voltage Vref2, and further is gradually increased up to the power supply voltage VCC. On the other hand, in such a case that an input voltage entered from the input terminal 48 is decreased from the power supply voltage VCC to 0 V during a time period defined from timing "t3" to timing "t4", after an output voltage outputted from the output terminal 43 is gradually decreased up to the reference voltage Vref2, this output voltage is rapidly decreased up to the reference voltage Vref1, and further is gradually decreased up to 0 V.

Considering now to an input of a noise component, this noise component owns a rapidly changing characteristic. That is, the noise component entered into the input terminal 48 of this output buffer circuit 4 when the input voltage is low (for example, 0 V), this noise component is rapidly increased. To the contrary, the output voltage is only gradually increased. Since this noise component immediately disappears and the input voltage is immediately lowered, substantially no adverse influences caused by this noise component are given to the output voltage. On one hand, the noise component entered into the input terminal 48 of this output buffer circuit 4 when the input voltage is high (for example, VCC), this noise component is rapidly decreased. To the contrary, the output voltage is only gradually decreased. Since this noise component immediately disappears and the input voltage is immediately increased, substantially no adverse influences caused by this noise component are given to the output voltage.

On the other hand, with respect to the inherent increase of the input voltage entered from the input terminal 48, the output voltage outputted from the output terminal 43 is rapidly increased from the reference voltage Vref1 up to the reference voltage Vref2. Also, as to the inherent decrease of the input voltage entered from the input terminal 48, the output voltage outputted from the output terminal 43 is rapidly decreased from the reference voltage Vref1 up to the reference voltage Vref2. As a consequence, the time duration until the output voltage can be shortened with respect to the change in the input voltage.

As previously described in detail, since the output voltage is rapidly changed between the reference voltage Vref1 and the reference voltage Vref2 in the output buffer 4 of the first embodiment, the time duration during which the penetration current of the CMOS transistor will flow can be shortened. As a result, the power consumption caused by this penetration current of the CMOS transistor can be suppressed. Moreover, since the circuit arrangement required to realize the above-explained feature may be realized by employing only 2 sets of comparators and several logic circuits, the circuit arrangement built in the IC chip can be made simple.

Moreover, since the output voltage is gradually increased,, or decreased with respect to either the rising operation or the falling operation of the input voltage, substantially no adverse influence caused by the noise component is given to the output voltage. In addition, since the reference voltages Vref1 and Vref2 are adjusted to proper voltages, the changing speed of the voltage can be controlled. As a consequence, the design policy can be easily set to the reduction of the power consumption, or the reduction of the noise component.

Figure 7:
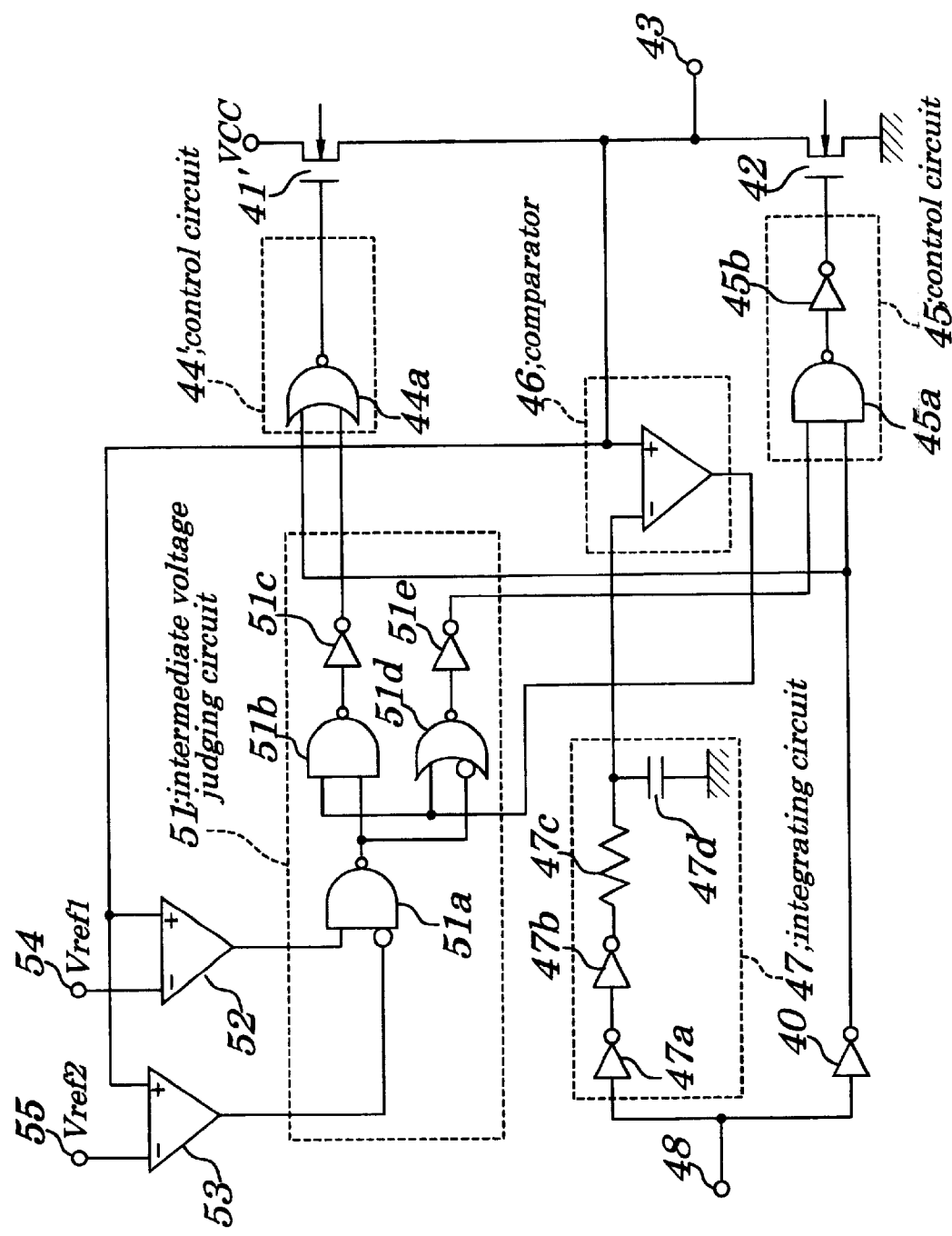
FIG. 7 indicates a circuit arrangement of an output buffer circuit according to another embodiment of the present invention.
Figure 8:
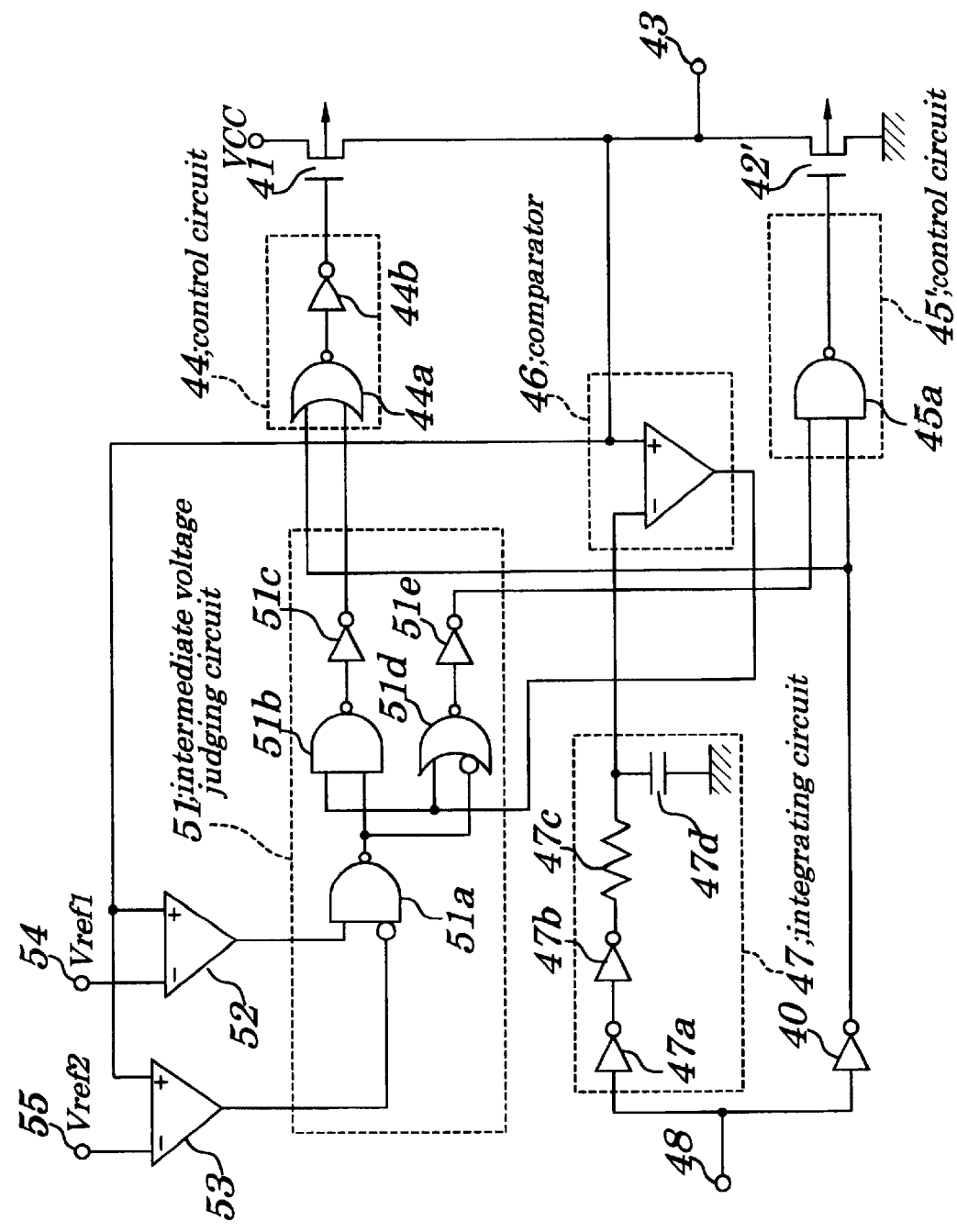
FIG. 8 represents a circuit arrangement of an output buffer circuit according to another embodiment of the present invention.
Figure 9:
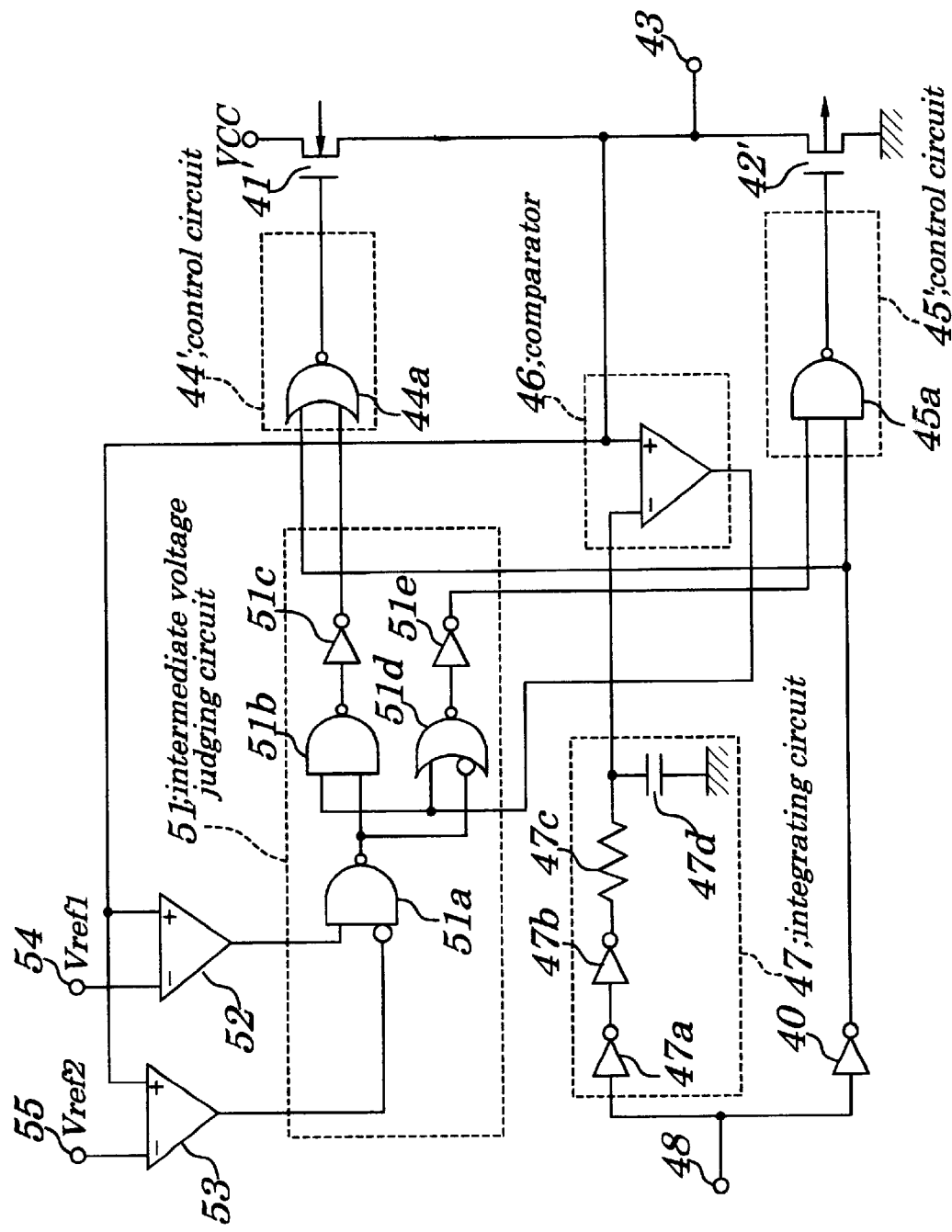
FIG. 9 shows a circuit arrangement of an output buffer circuit according to another embodiment of the present invention.
Figure 10:
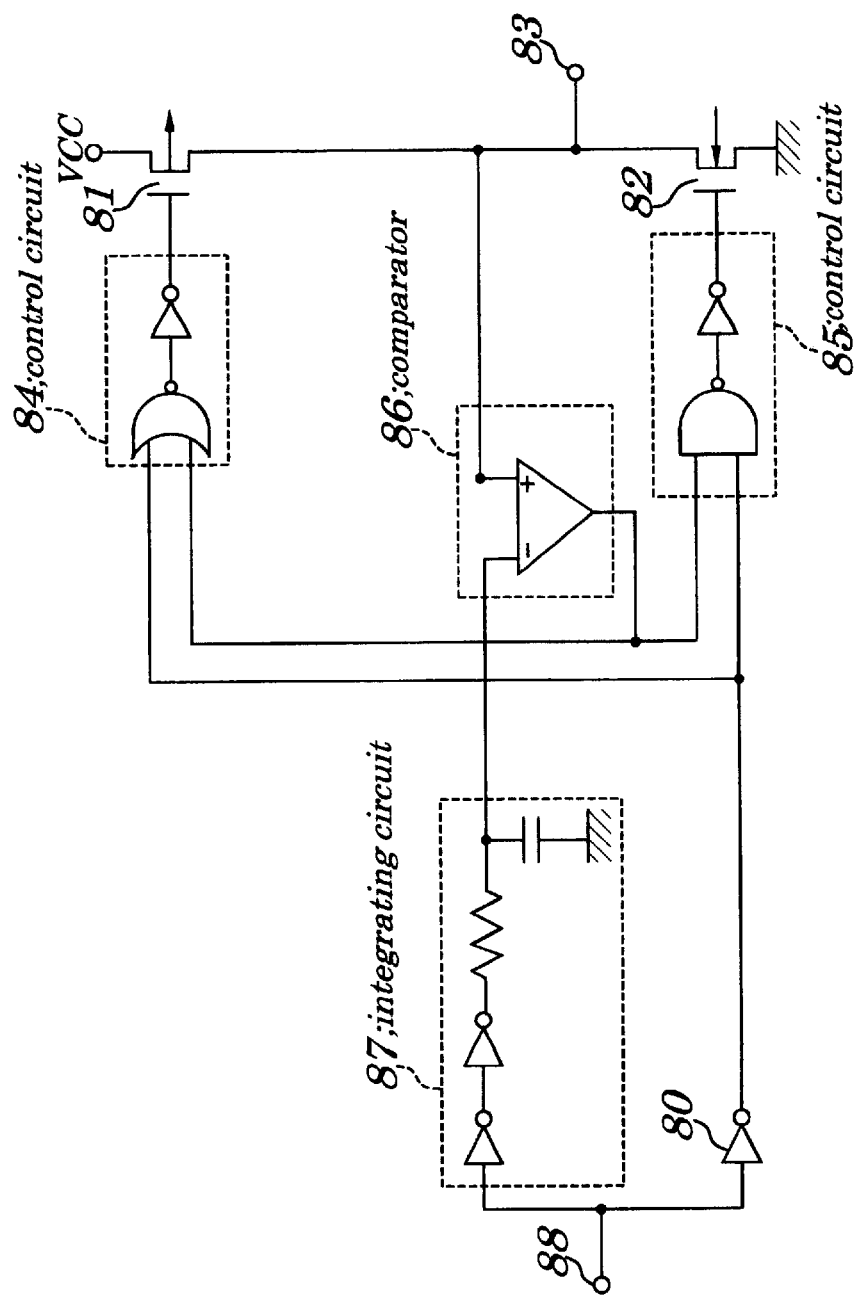
FIG. 10 indicates the circuit arrangement of the conventional output buffer circuit.

In the above-described embodiment, the output stage of the output buffer circuit 4 is arranged by the CMOS structure of the p-MOS transistor 41 and the n-MOS transistor 42. However, this output stage of the output buffer circuit 4 may be replaced by various structures, namely a structure shown in FIG. 6 in which the p-MOS transistor 41 is replaced by an n-MOS transistor 41'; another structure shown in FIG. 7 in which the n-MOS transistor 42 is replaced by a p-MOS transistor 42', and further on structure shown in FIG. 8 in which the p-MOS transistor 41 is replaced by an n-MOS transistor 41', and the n-MOS transistor 42 is replaced by a p-MOS transistor 42'. In this case, when the p-MOS transistor 41 is replaced by the n-MOS transistor 41', a control circuit 44' may be arranged by only a NOR gate 44a having no NOT gate. Also, when the n-MOS transistor 42 is replaced by the p-MOS transistor 42', a control circuit 45' may be arranged by only a NAND gate 45a having no NOT gate. These output buffer circuits having such alternative structures may be operated in a similar manner to that of the above-explained output buffer circuit 4.

In the above explained embodiment, the input signal entered from the input terminal 48 is integrated by the integrating circuit 47, and then, the comparator 46 compares the output signal from this integrating circuit 47 with the output signal of this output buffer circuit 4 outputted from the output terminal 43. However, the present invention is not limited to this embodiment mode only. For instance, the present inventive idea may be applied to such an output buffer circuit. That is, when the output voltage is changed, the intermediate voltage level may be compared with the reference voltage in a similar manner to that executed by the above-explained comparators 52 and 53. In response to this comparison result, the voltage applied to the gate of the MOS transistor at the output stage may be controlled.

As previously explained in detail, in accordance with the output buffer circuit of the present invention, the control signal entered into the control terminal of the transistor is controlled by the control circuit, so that the noise can be suppressed, and further the time duration during which the current flows between the transistors can be relatively shortened. As a consequence, the power consumption can be suppressed.

It is thus apparent that the present invention is not limited to the above embodiments but may be changed and modified without departing from the scope and spirit of the invention.

Finally, the present application claims the priority of Japanese Patent Application No. Hei9-324983 filed on Nov. 26, 1997, which is herein incorporated by reference.

What is claimed is:

1. An output buffer circuit comprising:
   an input terminal for inputting an externally supplied signal voltage into said output buffer circuit;
   a first transistor having a first current path, a first voltage being applied to one end of said first current path;
   a second transistor having a second current path, one end of said second current path being connected to the other end of said first current path and a second voltage being applied to the other end of said second current path;
   a first comparing circuit for comparing said signal voltage applied from said input terminal with a voltage appearing across said first transistor and second transistor and subdivided by both said first and second transistors;
   a second comparing circuit for comparing a reference voltage with the voltage appearing across said first transistor and said second transistor and subdivided by both said first and second transistors;
   a control circuit for supplying a control signal to control terminals of said first and second transistors based upon comparison results of said first and second comparing circuits so as to control a voltage change in said subdivided voltage between said first and second transistors with respect to said input signal voltage; and
   an output terminal for outputting a voltage appearing across said first transistor and said second transistor by controlling the voltage change in said subdivided voltage in response to said control signal in said control circuit.

2. The output buffer circuit according to claim 1 wherein:
   in such a case that said control circuit judges based upon the comparison result of said first comparing circuit that said input signal voltage is higher than said subdivided voltage appearing across said first transistor and said second transistor,
   while said second comparing circuit compares said voltage subdivided by said first and second transistors with said reference voltage, if said subdivided voltage becomes lower than said reference voltage, then said control circuit controls said control signal supplied to said control terminals of said first and second transistors in such a manner that said subdivided voltage is gradually increased, as compared with an increase of said input signal voltage; and
   while said second comparing circuit compares said voltage subdivided by said first and second transistors with said reference voltage, if said subdivided voltage becomes higher than said reference voltage, then said control circuit controls said control signal supplied to said control terminals of said first and second transistors in such a manner that said subdivided voltage is increased faster than said gradual increase performed when said subdivided voltage becomes lower than the reference voltage.

3. The output buffer circuit according to claim 2, further comprising:
   a delay circuit for delaying a voltage change contained in said input signal voltage to supply the delayed input signal voltage to said first comparing circuit.

4. An output buffer circuit according to claim 2 wherein:
   said first and second transistors are constituted by a CMOS transistor made of a p-MOS transistor and an n-MOS transistor.

5. An output buffer circuit according to claim 1 wherein:
   in such a case that said control circuit judges based upon the comparison result of said first comparing circuit that said input signal voltage is lower than said subdivided voltage appearing across said first transistor and said second transistor,
   while said second comparing circuit compares said voltage subdivided by said first and second transistors with said reference voltage, if said subdivided voltage becomes higher than said reference voltage, then said control circuit controls said control signal supplied to said control terminals of said first and second transistors in such a manner that said subdivided voltage is gradually decreased, as compared with a decrease of said input signal voltage; and
   while said second comparing circuit compares said voltage subdivided by said first and second transistors with said reference voltage, if said subdivided voltage becomes lower than said reference voltage, then said control circuit controls said control signal supplied to said control terminals of said first and second transistors in such a manner that said subdivided voltage is decreased faster than said gradual decrease performed when said subdivided voltage becomes higher than the reference voltage.

6. The output buffer circuit according to claim 5, further comprising:
   a delay circuit for delaying a voltage change contained in said input signal voltage to supply the delayed input signal voltage to said first comparing circuit.

7. The output buffer circuit according to claim 5 wherein:
   said first and second transistors are constituted by a CMOS transistor made of a p-MOS transistor and an n-MOS transistor.

* * * * *